United States Patent
Ishii et al.

(10) Patent No.: US 11,095,309 B2
(45) Date of Patent: Aug. 17, 2021

(54) ERROR CORRECTION DECODING DEVICE AND OPTICAL TRANSMISSION/RECEPTION DEVICE

(71) Applicant: MITSUBISHI ELECTRIC CORPORATION, Tokyo (JP)

(72) Inventors: Kenji Ishii, Tokyo (JP); Kazuo Kubo, Tokyo (JP); Kenya Sugihara, Tokyo (JP); Hideo Yoshida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 265 days.

(21) Appl. No.: 16/321,793

(22) PCT Filed: Feb. 2, 2017

(86) PCT No.: PCT/JP2017/003803
§ 371 (c)(1),
(2) Date: Jan. 29, 2019

(87) PCT Pub. No.: WO2018/042699
PCT Pub. Date: Mar. 8, 2018

(65) Prior Publication Data
US 2020/0382134 A1     Dec. 3, 2020

(30) Foreign Application Priority Data

Sep. 1, 2016   (WO) .................. PCT/JP2016/075693

(51) Int. Cl.
*H03M 13/11*   (2006.01)
*H03M 13/29*   (2006.01)
(Continued)

(52) U.S. Cl.
CPC .... *H03M 13/1174* (2013.01); *H03M 13/1128* (2013.01); *H03M 13/1185* (2013.01);
(Continued)

(58) Field of Classification Search
CPC ......... H03M 13/3972; H03M 13/2957; H03M 13/3753; H03M 13/1174; H03M 13/3707; H03M 13/1185; H03M 13/1128
See application file for complete search history.

(56) References Cited

U.S. PATENT DOCUMENTS 6,233,709 B1   5/2001   Zhang et al.
9,413,390 B1 *  8/2016   Yin .................... H03M 13/1117
(Continued)

FOREIGN PATENT DOCUMENTS

EP    2911304 A1    8/2015
JP   2008-193460 A   8/2008
(Continued)

OTHER PUBLICATIONS

Iyengar et al., "Windowed Decoding of Spatially Coupled Codes", 2011 IEEE International Symposium on Information Theory Proceedings (ISIT), pp. 2552-2556, Aug. 2011.
(Continued)

*Primary Examiner* — Guy J Lamarre
(74) *Attorney, Agent, or Firm* — Birch, Stewart, Kolasch & Birch, LLP

(57) ABSTRACT

Provided is an optical transmission/reception device including an error correction decoding unit (36) for decoding a received sequence encoded with an LDPC code, in which the error correction decoding unit (36) is configured to perform decoding processing using a parity check matrix (70) of a spatially-coupled LDPC code, which includes a plurality of parity check sub-matrices (71) combined with each other, in which the decoding processing is windowed decoding processing that uses a window (80) over one or more parity check sub-matrices (71), and in which a window size of the window (80) and a decoding iteration count due to throughput and requested correction performance are
(Continued)

variable and input from a control circuit (12) connected to the error correction decoding device (36).

6 Claims, 15 Drawing Sheets

(51) Int. Cl.
*H03M 13/37* (2006.01)
*H03M 13/39* (2006.01)

(52) U.S. Cl.
CPC ... *H03M 13/2957* (2013.01); *H03M 13/3707* (2013.01); *H03M 13/3753* (2013.01); *H03M 13/3972* (2013.01)

(56) References Cited

U.S. PATENT DOCUMENTS

| | | | | |
|---|---|---|---|---|
| 2004/0034827 A1* | 2/2004 | Shen | ........................ | H04L 1/005 714/758 |
| 2005/0283708 A1* | 12/2005 | Kyung | .............. | H03M 13/6393 714/758 |
| 2007/0162838 A1* | 7/2007 | Esumi | .............. | G11B 20/10194 714/800 |
| 2009/0094499 A1* | 4/2009 | Deoka | .................... | G11B 20/18 714/752 |
| 2011/0051831 A1 | 3/2011 | Subrahmanya et al. | | |
| 2013/0173982 A1* | 7/2013 | Moon | ................. | H03M 13/616 714/752 |
| 2013/0254633 A1 | 9/2013 | Obata et al. | | |
| 2014/0301263 A1* | 10/2014 | Ji | ...................... | H04W 52/0216 370/311 |
| 2015/0301788 A1* | 10/2015 | Johnston | ............ | H04N 21/4307 700/94 |
| 2016/0233979 A1* | 8/2016 | Koike-Akino | ...... | H03M 13/251 |
| 2020/0244286 A1* | 7/2020 | Kubo | ................ | H03M 13/3723 |

FOREIGN PATENT DOCUMENTS

| | | |
|---|---|---|
| JP | 2013-504253 A | 2/2013 |
| JP | 2013-198017 A | 9/2013 |

OTHER PUBLICATIONS

Iyengar et al., "Windowed Decoding of Spatially Coupled Codes", IEEE Transactions on Information Theory, vol. 59, No. 4, pp. 2277-2292, Apr. 2013.

Kudekar et al., "Threshold Saturation via Spatial Coupling: Why Convolutional LDPC Ensembles Perform So Well over the BEC", IEEE Transactions on Information Theory, vol. 57, No. 2, pp. 803-834, Feb. 2011.

* cited by examiner

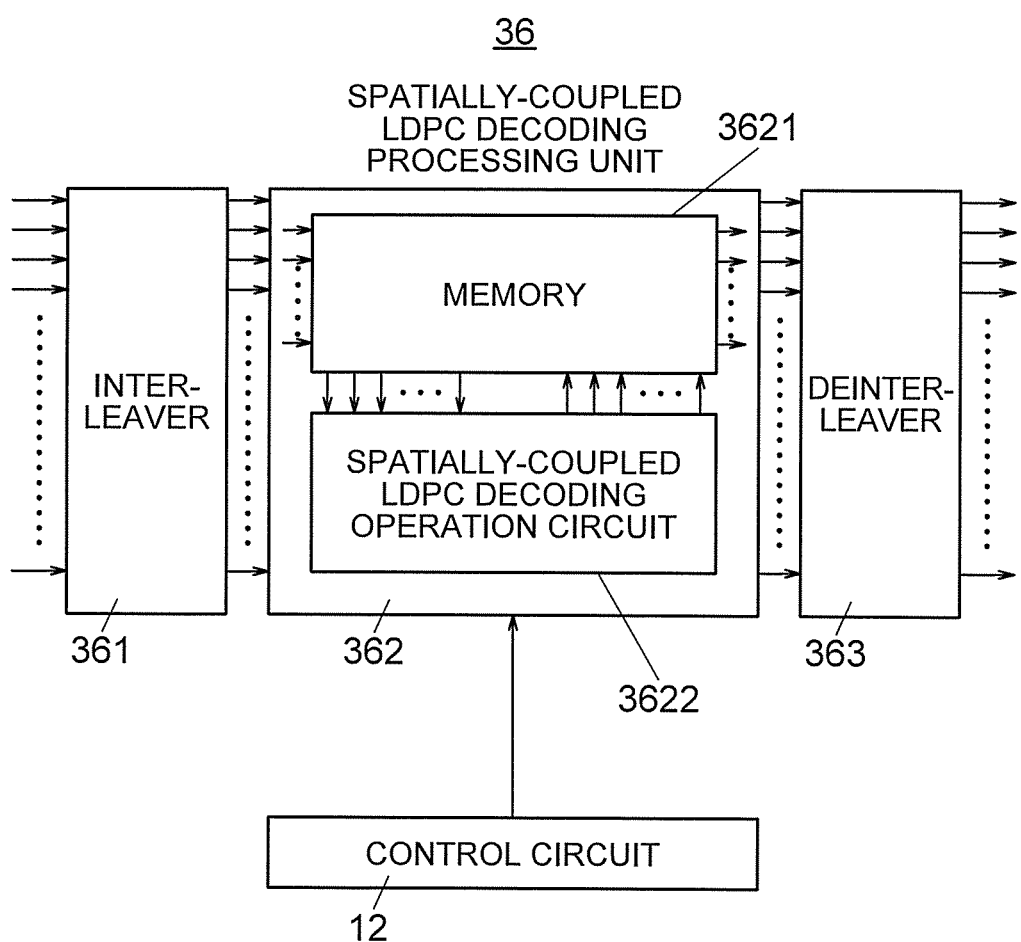

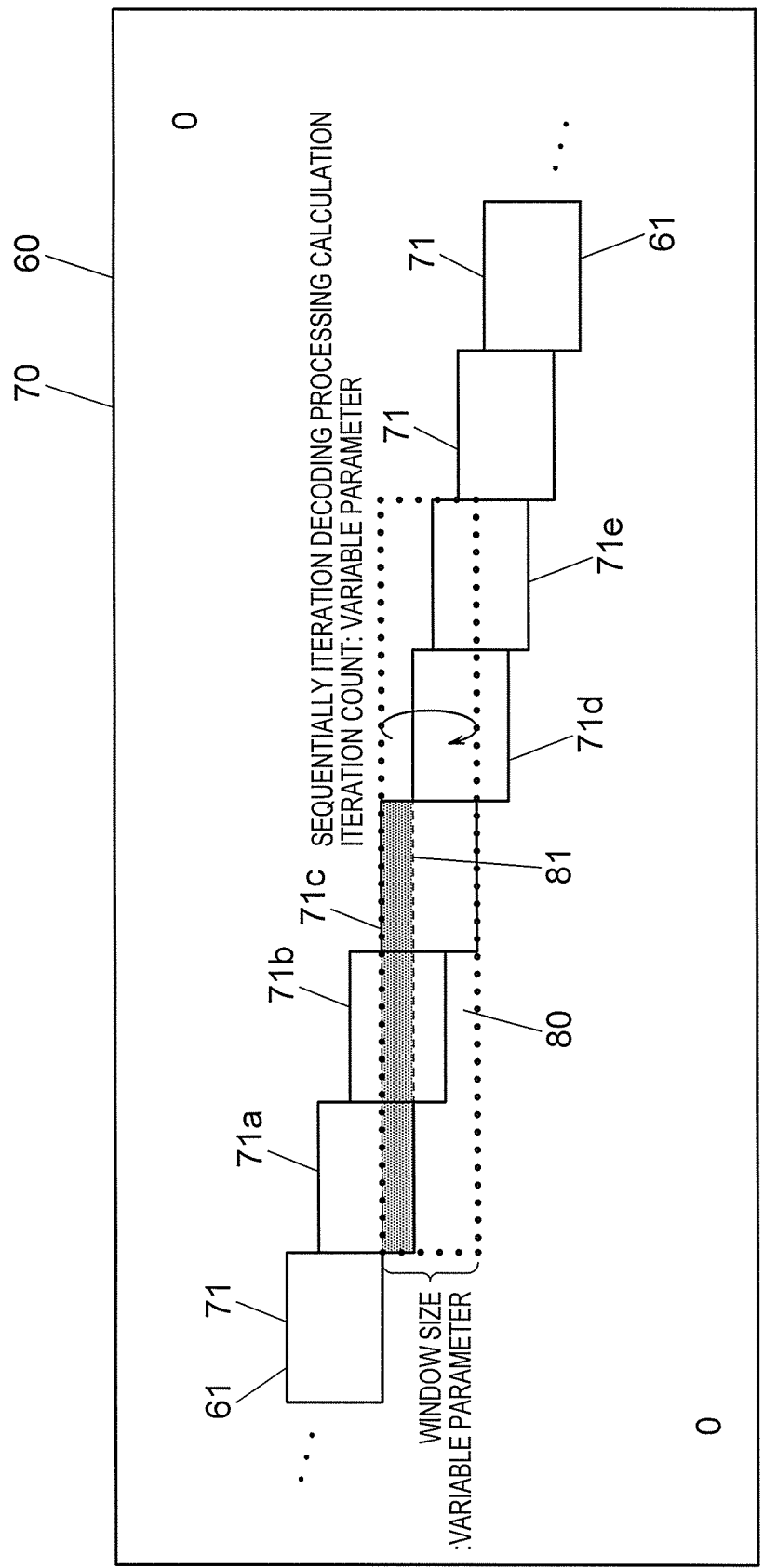

FIG. 6B $$H = \begin{bmatrix} A_{0,0} & A_{0,1} & \cdots & A_{0,K-1} \\ A_{1,0} & A_{1,1} & \cdots & A_{1,K-1} \\ \cdot & \cdot & \cdots & \cdot \\ A_{J-1,0} & A_{J-1,1} & \cdots & A_{J-1,K-1} \end{bmatrix}$$

FIG. 7A $$I_j = \begin{pmatrix} 0 & \cdots & 0 & \boxed{1} & 0 & \cdots & 0 \\ 0 & \cdots & 0 & 0 & 1 & \cdots & 0 \\ \vdots & & \vdots & & \vdots & \ddots & \\ 0 & 0 & 0 & 0 & 0 & 0 & 1 \\ 1 & 0 & 0 & 0 & 0 & 0 & 0 \\ \ddots & & & 0 & 0 & & \vdots \\ 0 & & \boxed{1} & 0 & 0 & \cdots & 0 \end{pmatrix}$$

$p$ COLUMNS / $t$-th COLUMN / $(t-1)$th COLUMN / $p$ ROWS

FIG. 7B $$I_5^{(1)} = \begin{bmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 0 & 0 & 0 \end{bmatrix}$$

ERROR CORRECTION DECODING DEVICE AND OPTICAL TRANSMISSION/RECEPTION DEVICE

TECHNICAL FIELD

The present invention relates to an error correction decoding device and an optical transmission/reception device.

BACKGROUND ART

In optical transmission systems in recent years, an error correction code is generally applied to the system as an effective method of implementing transfer with a high capacity for a long distance. The error correction code is a technology to be used in, for example, a wired/wireless communication system and a storage device. The error correction code is a technology of enabling, even when there is an error (bit) in received data, correction of the error by adding a redundant bit to digital data to be transmitted by a transmission side.

Various schemes such as a hamming code, a Bose-Chaudhuri-Hocquenghem (BCH) code, and a Reed-Solomon (RS) code are proposed as the error correction coding and decoding scheme.

The error correction code can be applied to detect and correct an error that is caused in a transfer path, but there is a limitation on the number of correctable error bits. Further, the number of correctable error bits differs depending on the error correction performance and decoding scheme of an error correction coding scheme.

In the error correction code, transmission data (containing an overhead forming a frame, for example) is called an "information bit", and a redundant bit to be added to the information bit is called a "parity bit". The parity bit is calculated from an information bit with a calculation method that is different depending on the error correction coding scheme. Further, a bit string obtained by combining the information bit and the parity bit is called a "codeword".

In the error correction code called a "block code", a parity bit is calculated from an information bit in units of the number of bits set in advance. In other words, the numbers of information bits and parity bits in one codeword are determined in advance, and are called an "information bit length" and a "parity bit length", respectively. Further, the number of bits of a codeword is called a "code length".

In a metro-core optical transmission system used for a submarine cable and inter-city communication, a demand for expansion of a transfer capacity and a transfer distance is remarkable, and a stronger error correction code is applied and proposed on a daily basis. In recent years, a low-density parity-check (LDPC) code has been widely used as the error correction code. The LDPC code is a block code that is defined by a sparse parity-check matrix with a small number of non-zero elements.

Further, the configuration of a spatially-coupled forward error correction (FEC) is proposed in, for example, Non-Patent Literature 1 and Non-Patent Literature 2, as a technique of implementing improvement of the error correction performance of the LDPC code. In the configuration of the spatially-coupled FEC, a spatially-coupled LDPC code is used. The spatially-coupled LDPC code is one of convolutional LDPC codes, which is obtained by applying the basic structure of the convolutional LDPC code and converting a code sequence from a continuous sequence to an end-of-block sequence. In the spatially-coupled LDPC code, a parity check sub-matrix is used to form a submatrix of the spatially-coupled LDPC code, and a plurality of check sub-matrices are combined diagonally to form a larger parity check matrix. This parity check matrix serves as a parity check matrix of the spatially-coupled LDPC code.

In Non-Patent Literature 1, it is indicated that a belief propagation (BP) decoding method can be used to achieve a high error correction performance near a theoretical limit.

However, the spatially-coupled LDPC code causes expansion of a decoding circuit and delay, although the spatially-coupled LDPC code is expected to exhibit improvement in performance as the combined code length becomes larger. Thus, in Non-Patent Literature 2, application of windowed decoding to a spatially-coupled LDPC code is proposed as a method of suppressing an increase in circuit scale and delay.

CITATION LIST

Non Patent Literature

[NPL 1] S. Kudekar, T. Richardson, and R. L. Urbanke, "Threshold saturation via spatial coupling: Why convolutional LDPC ensembles perform so well over the BEC," IEEE Trans. Inf. Theory, vol. 57, no. 2, pp. 803-834, February 2011.

[NPL 2] A. R. Iyengar, P. H. Siegel, R. L. Urbanke and J. K. Wolf, "Windowed decoding of spatially coupled codes," Proc. 2011 IEEE Int. Symp. Inf. Theory (ISIT), pp. 2552-2556, August 2011.

SUMMARY OF INVENTION

Technical Problem

In optical transmission systems in recent years, an accommodation system has various client rates due to expansion of the transfer capacity. For example, in an IEEE system, Flex Ethernet (trademark), which is a 200 Gb Ethernet or a 400 Gb Ethernet having a transfer capacity of a 100 Gb Ethernet or more and enables flexible accommodation of a signal, is being standardized. Further, in the ITU-T Recommendation G.709/Y.1331, a frame format (OTUCn), which can be used for an interface of up to 25.6 Tb/s in units of n×100 G (n is integer) is being standardized as an optical transfer network of more than 100 G. An optical transceiver constructing an optical transfer device is required to have a function of accommodating those plurality of client signals flexibly and transferring those signals to a line side at the same rate.

In Non-Patent Literature 1, a BP decoding method is proposed to be used to implement a high error correction performance. Further, in Non-Patent Literature 2, the spatially-coupled LDPC code and windowed decoding are proposed to be used to implement a strong error correction performance with the configuration of a low-circuit scale with a relatively lower complexity. However, in any one of Non-Patent Literatures 1 and 2, the configuration for various transfer rates (throughputs) is not proposed. Thus, in the related-art error correction circuits, handling of various transfer rates (throughputs) has not been hitherto discussed.

Further, adjustment of a correction capability in consideration of input error rates that differ depending on the transfer distance has not also been discussed.

The present invention has been made to solve the above-mentioned problems, and has an object to provide an error correction decoding device and an optical transmission/reception device capable of handling various transfer rates (throughputs).

Further, the present invention has an object to provide an error correction decoding device capable of handling performance quality depending on a transfer distance.

Solution to Problem

According to one embodiment of the present invention, there is provided an optical transmission/reception device including an error correction decoding device for decoding a received sequence encoded with an LDPC code, wherein the error correction decoding device is configured to perform decoding processing using a parity check matrix of a spatially-coupled LDPC code, wherein the parity check matrix of the spatially-coupled LDPC code includes a plurality of parity check sub-matrices combined with each other in an LDPC rule structure, wherein the decoding processing is windowed decoding processing of sequentially performing decoding in units of windows by using a window over one or more parity check sub-matrices, wherein the windowed decoding processing is repeatedly executed by a number of times of a decoding iteration count, wherein a window size of the window and the decoding iteration count are variable, and wherein the window size and the decoding iteration count are input from a control circuit connected to the error correction decoding device.

Further, according to another embodiment of the present invention, there is provided an error correction decoding device for decoding a received sequence encoded with an LDPC code, the error correction decoding device being configured to control a number of times of a decoding iteration count, which determines a performance in performing decoding processing using a parity check matrix of the LDPC code, in accordance with throughput and requested correction performance, to thereby repeatedly execute decoding, in which the decoding iteration count is set variable.

Advantageous Effects of Invention

The error correction decoding device of the optical transmission/reception device according to one embodiment of the present invention performs the windowed decoding processing, and the window size and decoding iteration count of the windowed decoding processing are set variable and input from the control circuit. Therefore, it is possible to flexibly handle throughput of various granularities without changing the circuit configuration at all.

Further, the error correction decoding device according to another embodiment of the present invention sets the decoding iteration count that depends on the transfer speed and transfer distance variable, and the decoding iteration count is input from the control circuit. Therefore, it is possible to flexibly handle throughput and performance of various granularities without changing the circuit configuration at all, resulting in suppression of power consumption.

BRIEF DESCRIPTION OF DRAWINGS

FIG. 5 is a block diagram for illustrating a configuration of an error correction decoding unit included in the optical transmission/reception device according to the first embodiment of the present invention.

FIG. 6A is a diagram for illustrating an example of a parity check matrix of a spatially-coupled LDPC code to be used in the error correction decoding unit of the optical transmission/reception device according to the first embodiment of the present invention.

FIG. 6B is a diagram for illustrating an example of a parity check matrix of a quasi-cyclic LDPC code forming a parity check sub-matrix contained in the parity check matrix of the spatially-coupled LDPC code to be used in the error correction decoding unit of the optical transmission/reception device according to the first embodiment of the present invention.

FIG. 7A is a diagram for illustrating an example of a cyclic permutation matrix.

FIG. 7B is a diagram for illustrating an example of the cyclic permutation matrix.

DESCRIPTION OF EMBODIMENTS

First Embodiment

Figure 1:
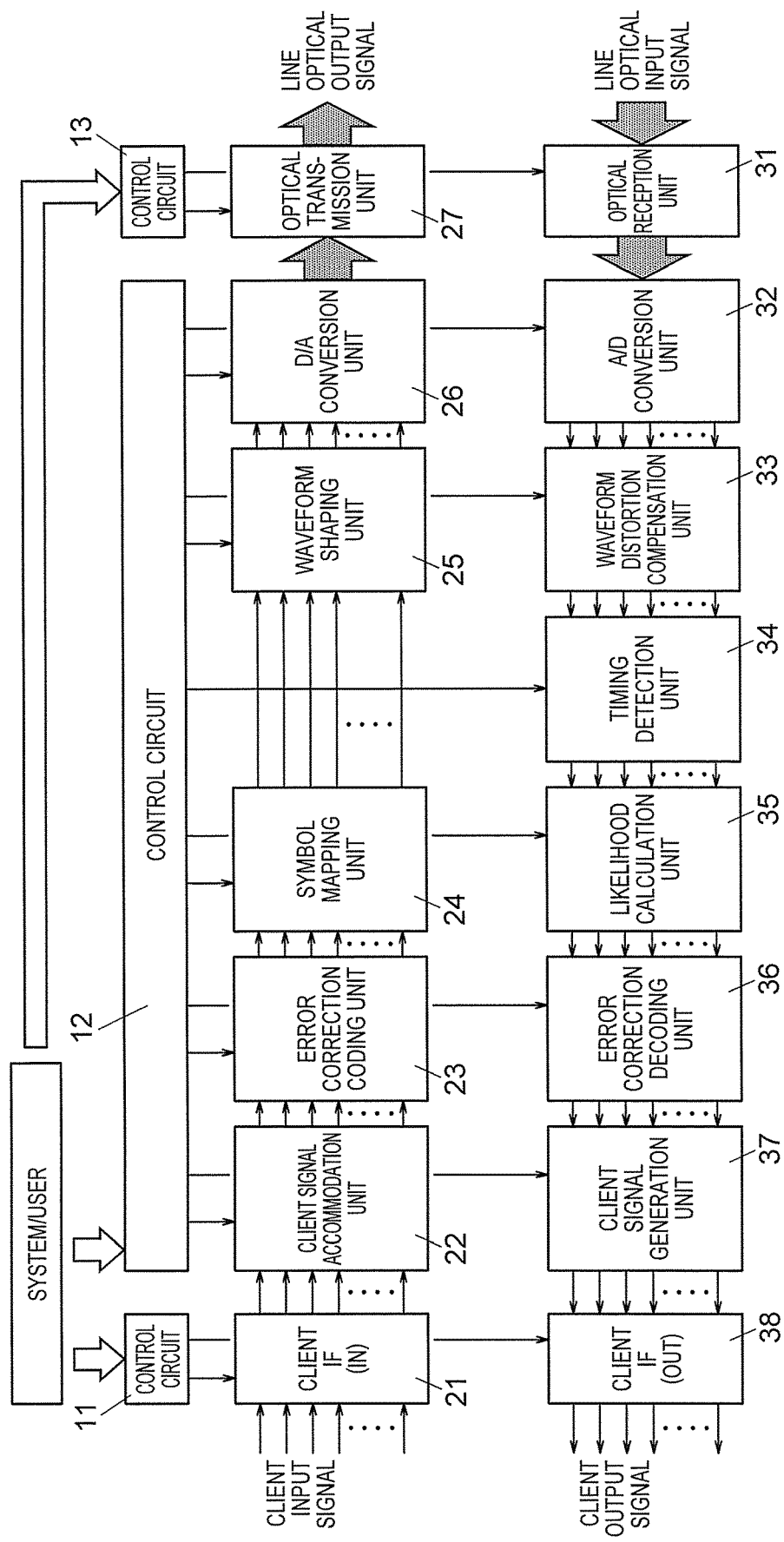
FIG. 1 is a block diagram for illustrating a configuration of an optical transmission/reception device according to a first embodiment of the present invention.

FIG. 1 is a block diagram for illustrating a configuration of an optical transmission/reception device according to a first embodiment of the present invention. An error correction decoding unit including an error correction decoding device is mounted in the optical transmission/reception device. In the following, a description is given of the configuration of the optical transmission/reception device.

In FIG. 1, a client IF (IN) 21 is an input interface circuit to which a client signal is to be input. A client signal is input to the client IF (IN) 21 by a system or user. The client signal is a signal to be transmitted by the optical transmission/reception device. A client signal accommodation unit 22 is connected to the client IF (IN) 21.

A client signal, which is input to the client IF (IN) 21, is input to the client signal accommodation unit 22. The client signal accommodation unit 22 is a framing circuit configured to accommodate a client signal in a transfer frame and frame the client signal into a form appropriate for subsequent processing. An error correction coding unit 23 is connected to the client signal accommodation unit 22.

A transfer frame generated by the client signal accommodation unit 22 is input to the error correction coding unit 23. The error correction coding unit 23 adds a parity bit to an input transfer frame in accordance with any rule to generate a codeword. A symbol mapping unit 24 is connected to the error correction coding unit 23.

A codeword generated by the error correction coding unit 23 is input to the symbol mapping unit 24. The symbol mapping unit 24 is a mapping processing circuit for coding an input codeword into a form suitable for transfer on the line side and causing the input codeword to take multiple values. A waveform shaping unit 25 is connected to the symbol mapping unit 24.

A signal output from the symbol mapping unit 24 is input to the waveform shaping unit 25. The waveform shaping unit 25 is a signal processing circuit for equalizing the analog waveform of an input signal in time and frequency regions and shaping the analog waveform into a form appropriate for transfer. A D/A conversion unit 26 is connected to the waveform shaping unit 25.

A digital signal generated by the waveform shaping unit 25 is input to the D/A conversion unit 26. The D/A conversion unit 26 is a D/A converter configured to convert an input digital signal into an analog electric signal. An optical transmission unit 27 is connected to the D/A conversion unit 26.

An analog electric signal output from the D/A conversion unit 26 is input to the optical transmission unit 27. The optical transmission unit 27 is an optical transmission circuit configured to convert an input analog electric signal into an optical signal, and transfer the optical signal to an optical fiber.

The configuration of from the client IF (IN) 21 to the optical transmission unit 27 described above is a configuration of the optical transmission/reception device on a transmission side.

In FIG. 1, an optical reception unit 31 is configured to receive an optical signal transferred through an optical fiber. The optical reception unit 31 includes an optical receiver for converting the received optical signal into an analog electric signal. An A/D conversion unit 32 is connected to the optical reception unit 31.

An analog electric signal is input to the A/D conversion unit 32 from the optical reception unit 31. The A/D conversion unit 32 includes an A/D converter configured to convert the analog electric signal into a digital signal. A waveform distortion compensation unit 33 is connected to the A/D conversion unit 32.

A digital signal output from the A/D conversion unit 32 is input to the waveform distortion compensation unit 33. The waveform distortion compensation unit 33 is a signal processing circuit for equalizing the digital signal in the time and frequency regions for compensation so as to obtain an original signal that would have been transmitted. The waveform distortion compensation unit 33 compensates for distortion incurred in a transfer path or an optical analog front end. A timing detection unit 34 is connected to the waveform distortion compensation unit 33.

A signal compensated for by the waveform distortion compensation unit 33 is input to the timing detection unit 34. The timing detection unit 34 includes a timing detection processing circuit configured to detect the head of a transfer frame from the signal and adjust the timing. The timing detection unit 34 detects and aligns the head of a transfer frame based on the signal compensated for by the waveform distortion compensation unit 33. A likelihood calculation unit 35 is connected to the timing detection unit 34.

An aligned signal output from the timing detection unit 34 is input to the likelihood calculation unit 35. The likelihood calculation unit 35 includes a likelihood calculation circuit configured to calculate a log-likelihood ratio (LLR) of each bit subjected to symbol mapping. An error correction decoding unit 36 is connected to the likelihood calculation unit 35.

The error correction decoding unit 36 is an error correction decoding device according to the first embodiment of the present invention. The error correction decoding unit 36 includes a function for handling various transfer rates (throughputs). An LLR of each bit is input to the error correction decoding unit 36 from the likelihood calculation unit 35. The error correction decoding unit 36 is configured to perform error correction decoding processing on a received signal based on the LLR. The configuration of the error correction decoding unit 36 is described later. A client signal generation unit 37 is connected to the error correction decoding device 36.

A signal whose error has been corrected by the error correction decoding unit 36 is input to the client signal generation unit 37. The client signal generation unit 37 is a client signal generation circuit configured to align the signal whose error has been corrected, to thereby produce each client signal. When a parity bit for HD-FEC is added to the received transfer frame, the client signal generation unit 37 also performs decoding processing for the HD-FEC. The client signal generation unit 37 retrieves a signal subjected to the decoding processing as each client signal, and adds an overhead to the signal as required. A client IF (OUT) 38 is connected to the client signal generation unit 37.

A client signal generated by the client signal generation unit 37 is input to the client IF (OUT) 38. The client IF (OUT) 38 is an output interface circuit configured to output an input client signal. The client IF (OUT) 38 is configured to output an input client signal to, for example, each client module provided outside.

The configuration of from the optical reception unit 31 to the client IF (OUT) 38 described above is a configuration of the optical transmission/reception device on a reception side.

In the following, the client IF (IN) 21 and the client IF (OUT) 38 are collectively referred to as a "client-side analog interface unit".

Further, the components of from the client signal accommodation unit 22 to the D/A conversion unit 26 and the components of from the A/D conversion unit 32 to the client signal generation unit 37 are hereinafter collectively referred to as an "optical analog modulation/demodulation unit".

Further, the optical transmission unit 27 and the optical reception unit 31 are hereinafter collectively referred to as a "digital signal processing unit".

In FIG. 1, control circuits 11, 12, and 13 are control circuits for controlling the above-mentioned units 21 to 38 by receiving the setting from the system or user. The control circuit 11 is included in the client-side analog interface unit. The control circuit 12 is included in the optical analog modulation/demodulation unit. The control circuit 13 is included in the digital signal processing unit. In this manner, in the first embodiment, one control circuit is included in each of the client-side analog interface unit, the digital signal processing unit, and the optical analog modulation/demodulation unit. However, in the first embodiment, only one common control circuit may be provided to the client-side analog interface unit, the digital signal processing unit, and the optical analog modulation/demodulation unit, and the first embodiment can be implemented in that case as well.

Next, a description is given of an operation of the optical transmission/reception device according to the first embodiment.

Figure 2:
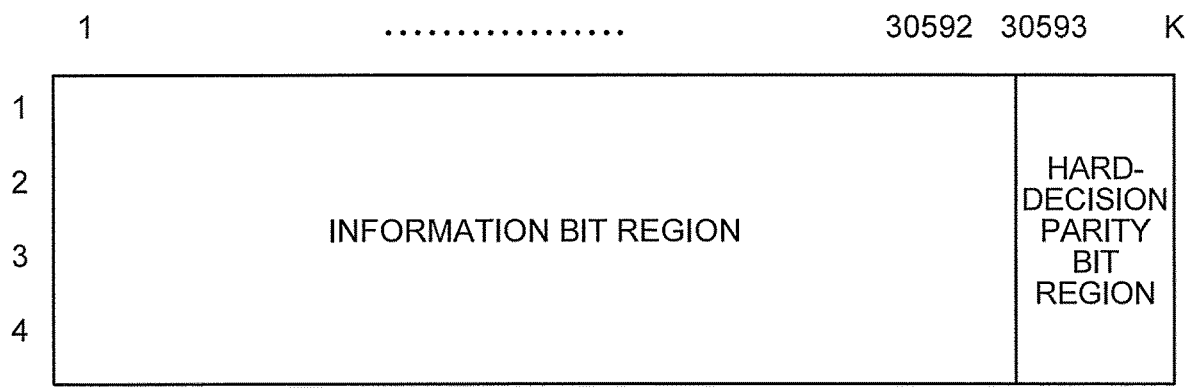
FIG. 2 is a diagram for illustrating a frame structure of a signal to be transmitted/received by the optical transmission/reception device according to the first embodiment of the present invention.

On the transmission side, first, various client signals accommodated by the optical transmission/reception device according to the first embodiment are input to the client IF (IN) 21. The client IF (IN) 21 is, for example, a CAUI-4 or a CAUI-10 when the standard is 100 Gb Ethernet. However, any configuration may be adopted in the first embodiment. The input signal is accommodated into a transfer frame by the client signal accommodation unit 22, and is framed into a form appropriate for long-distance transfer on the line side. The client signal accommodation unit 22 adds a parity bit of a hard-decision error correction code (HD-FEC) as an external code as required. FIG. 2 is an illustration of a frame structure of a transfer frame in a case where, for example, a frame format on the line side is set to OTU4 (redundancy of HD-FEC is indefinite). In the example illustrated in FIG. 2, a hard-decision parity bit region is added to an information bit region. The hard-decision parity bit region accommodates the parity bit for HD-FEC. In the OTU4, the transfer capacity per unit time is 104.7944 Gbps (not including parity bit). Thus, in the following description, the structure illustrated in FIG. 2 is used as a frame format, and an error correction coding unit and an error correction decoding device to/from which signals are input/output in units of about 100 Gbps are used as the error correction coding unit 23 and the error correction decoding device 36. However, the first embodiment is not limited thereto.

Figure 3:
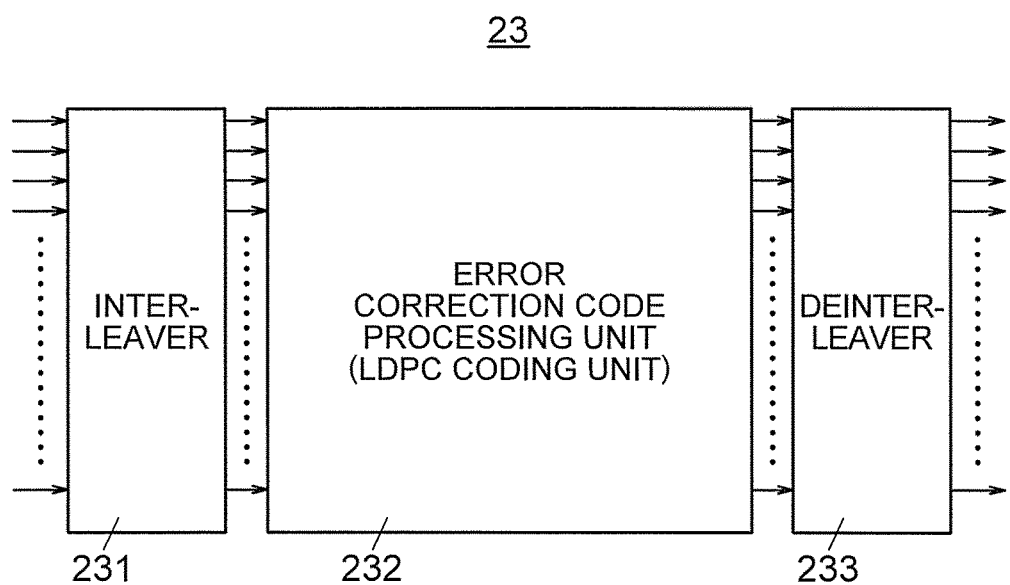
FIG. 3 is a diagram for illustrating a configuration of an error correction coding unit included in the optical transmission/reception device according to the first embodiment of the present invention.
Figure 4:
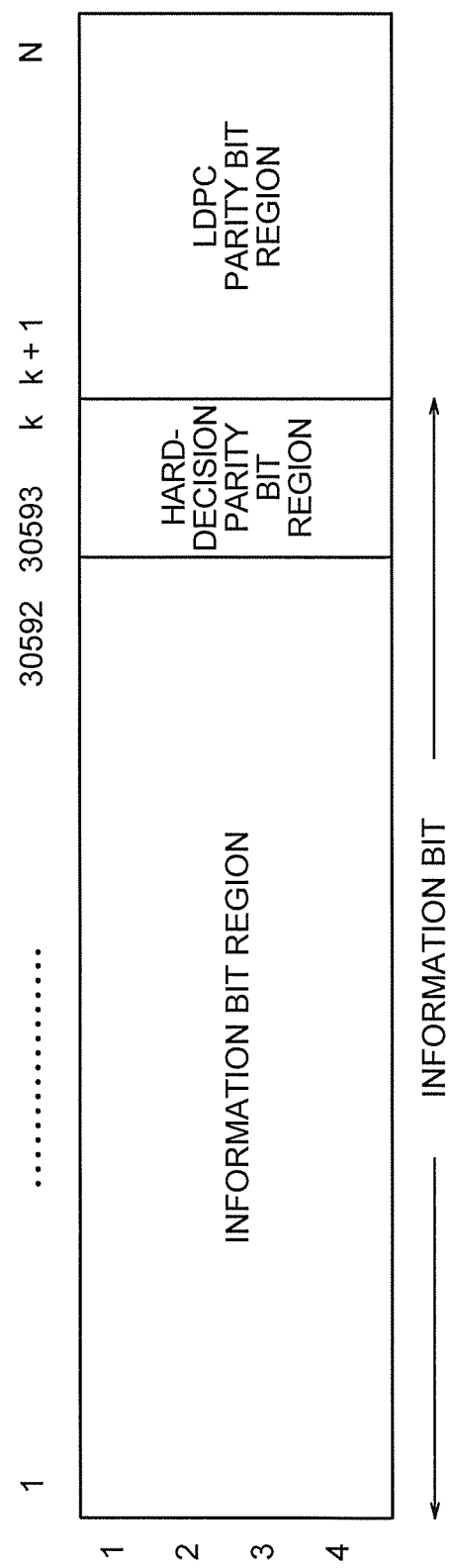
FIG. 4 is a diagram for illustrating a frame structure of a signal to be output from the error correction coding unit included in the optical transmission/reception device according to the first embodiment of the present invention.

FIG. 3 is an illustration of an example of the configuration of the error correction coding unit 23 according to the first embodiment. In the example illustrated in FIG. 3, the error correction coding unit 23 includes an LDPC coding circuit 232 serving as an error correction code processing unit, and an interleaver 231 and a deinterleaver 233 provided on both sides thereof. n×100 G (n is integer) signals are input to the interleaver 231 in accordance with a bit rate of accommodation by the client signal accommodation unit 22. The signal is accommodated in an OTU4 frame format. The interleaver 231 interleaves the input signal, and inputs the input signal into the LDPC coding circuit 232. The LDPC coding circuit 232 adds a parity bit based on an LDPC parity generation rule to the input signal, and inputs the obtained signal into the deinterleaver 233. The deinterleaver 233 deinterleaver the input signal, and inputs the obtained signal into the symbol mapping unit 24. When a parity bit for HD-FEC is added to the frame structure input to the LDPC coding circuit 232, the LDPC coding circuit 232 also processes the parity bit for HD-FEC as the information bit. FIG. 4 is an illustration of a frame structure to be output from the deinterleaver 233 of the error correction coding unit 23. In the frame structure of FIG. 4, the information bit region accommodating a client signal and the hard-decision parity bit region are set as the information bit. An LDPC parity bit region is added to the information bit. The redundancy of the error correction code differs depending on the requested modulation scheme and transfer performance. Thus, k and N (integers satisfying k>30,592 and N>k) relating to the frame format are not defined in the first embodiment. Further, the LDPC parity bit region is not necessarily required to be set at the last of the frame structure, and the LDPC parity bit region may be inserted into the middle of the frame structure.

A signal output from the error correction coding unit 23 is input to the symbol mapping unit 24, and is converted into a form suitable for transfer on the line side. A technique of converting the signal by the symbol mapping unit 24 includes converting the signal to take multiple values, multi-dimensional coding, and differential coding. Further, the technique of converting the signal by the symbol mapping unit 24 includes, for example, adding a pilot (known) signal to be used for processing in a subsequent stage. An output signal from the symbol mapping unit 24 is input to the waveform shaping unit 25. The waveform shaping unit 25 equalizes the quasi-analog waveform of an input signal in the time region, the frequency region, or both the regions, to thereby shape the waveform. The method of shaping the waveform by the waveform shaping unit 25 includes, for example, Nyquist filtering or band compensation by an analog unit. Output from the waveform shaping unit 25 is converted by the D/A conversion unit 26 into an analog electric signal. The analog electric signal output from the D/A conversion unit 26 is converted into an optical signal by the optical transmission unit 27, and transmitted to a transfer path, for example, an optical fiber.

On the reception side, first, the optical reception unit 31 inputs an optical signal transferred via the optical fiber. The optical reception unit 31 converts the received optical signal into an analog electric signal. The analog electric signal output from the optical reception unit 31 is input to the A/D conversion unit 32. The A/D conversion unit 32 converts the input analog electric signal into a digital signal. The digital signal is input to the waveform distortion compensation unit 33. The waveform distortion compensation unit 33 performs processing of compensating for distortion of the digital signal, which is incurred at, for example, a transfer path or an optical analog front end. The method of compensating for distortion includes, for example, linear compensation such as band compensation and disperse compensation, non-linear compensation by a fiber or an optical device, a frequency offset of a transmission/reception optical source, or phase compensation. Output from the waveform distortion compensation unit 33 is input to the timing detection unit 34. The timing detection unit 34 detects the timing, and then detects the head of a frame or the head of a multi-frame as required for alignment. The likelihood calculation unit 35 receives the compensated signal, calculates the LLR of each bit subjected to symbol mapping, and inputs the LLR to the error correction decoding device 36.

FIG. 5 is a diagram for illustrating an example of a configuration of the error correction decoding unit 36 according to the first embodiment. In the example illustrated in FIG. 5, the error correction decoding unit 36 includes a spatially-coupled LDPC decoding processing unit 362, and a deinterleaver 363 and an interleaver 361 which are provided on both sides of the spatially-coupled LDPC decoding processing unit 362. The spatially-coupled LDPC decoding processing unit 362 inputs n×100 G (n is integer) signals from the line side, and outputs n×100 G (n is integer) signals of an OTU4 (V) structure. As illustrated in FIG. 5, the spatially-coupled LDPC decoding processing unit 362 includes a memory 3621 and a spatially-coupled LDPC decoding operation circuit 3622. Further, the spatially-coupled LDPC decoding processing unit 362 is controlled by the control circuit 12. The spatially-coupled LDPC decoding processing unit 362 performs decoding processing by using such a parity check matrix as illustrated in FIG. 6A.

In FIG. 6A, a quadrangle 60 serving as an enclosure indicates the entire parity check matrix 70 (M×N) of the spatially-coupled LDPC code, and a quadrangle 61 within the quadrangle 60 indicates a partial matrix of the spatially-coupled LDPC code. This partial matrix is hereinafter referred to as "parity check sub-matrix 71". Matrix elements of the parity check matrix 70 of the spatially-coupled LDPC code indicated by the quadrangle 60 all take 0 in parts other than the parity check sub-matrix 71.

The parity check sub-matrix 71 is a parity check matrix itself. The parity check matrix 70 of the spatially-coupled LDPC code is an LDPC convolutional code formed by connecting the basic parity check sub-matrices 71 in an LDPC rule structure. As illustrated in FIG. 6A, the parity check sub-matrices 71 are combined so as to be aligned obliquely in a right bottom direction to form the larger parity check matrix 70. The adjacent parity check sub-matrices 71 are shifted by k rows set in advance (k is integer of 1 or more).

For example, a quasi-cyclic (QC) LDPC code (hereinafter referred to as "QC-LDPC code") can be applied to the parity check sub-matrix 71. Now, the QC-LDPC code is simply described. Now, the parity check matrix H of an LDPC code illustrated in FIG. 6B is assumed as the parity check sub-matrix 71. The parity check matrix H is formed of a plurality of partial matrices (also called "block matrix") $A_{j,k}$. When those partial matrices $A_{j,k}$ are limited to any one of a cyclic permutation matrix and a zero matrix, the parity check matrix H is a QC-LDPC code. Regarding the QC-LDPC code, the configuration of the parity check matrix and implementation of the circuit are relatively easy, and are often used for practical use.

The cyclic permutation matrix is a matrix obtained by subjecting a unit matrix to cyclic shifting. In FIG. 7A, an example of the cyclic permutation matrix is illustrated. The cyclic permutation matrix illustrated in FIG. 7A is a p×p matrix. When a matrix element at an x-th row and y-th column of the cyclic permutation matrix is denoted by (x, y), matrix elements (1, t), (2, t+1), (3, t+2), . . . , (t, p) are 1. Further, matrix elements (t+1, 1), (t+2, 2), . . . , (p, t−1) are 1. Other matrix elements are all 0. In this manner, in the cyclic permutation matrix, a plurality of unit matrices are subjected to cyclic shifting. The cyclic permutation matrix is denoted by $I_p^{(a)}$ by using a size "p" of the matrix and a shift value "a" in the right direction of the row. $I_p^{(0)}$ is a unit matrix. Further, for example, $I_5^{(1)}$ is a matrix illustrated in FIG. 7B. Thus, the cyclic permutation matrix of FIG. 7A is denoted by $I_p^{(t-1)}$ because the size of the matrix indicates "p" and the (1, t) matrix element indicates "1", resulting in a shift value "a" of "t−1".

In the first embodiment, the error correction decoding unit 36 performs windowed decoding processing in units of window size over a plurality of parity check sub-matrices. In the example of FIG. 6A, as indicated by the thick dotted lines, a window 80 over the five parity check sub-matrices 71 is illustrated. Specifically, in the example of FIG. 6A, the window 80 extends over the five parity check sub-matrices 71, namely, the parity check sub-matrices 71a, 71b, 71c, 71d, and 71e. However, the number of parity check sub-matrices 71 contained in the window 80 is not limited to five, and any number of parity check sub-matrices may be set.

Figure 8:
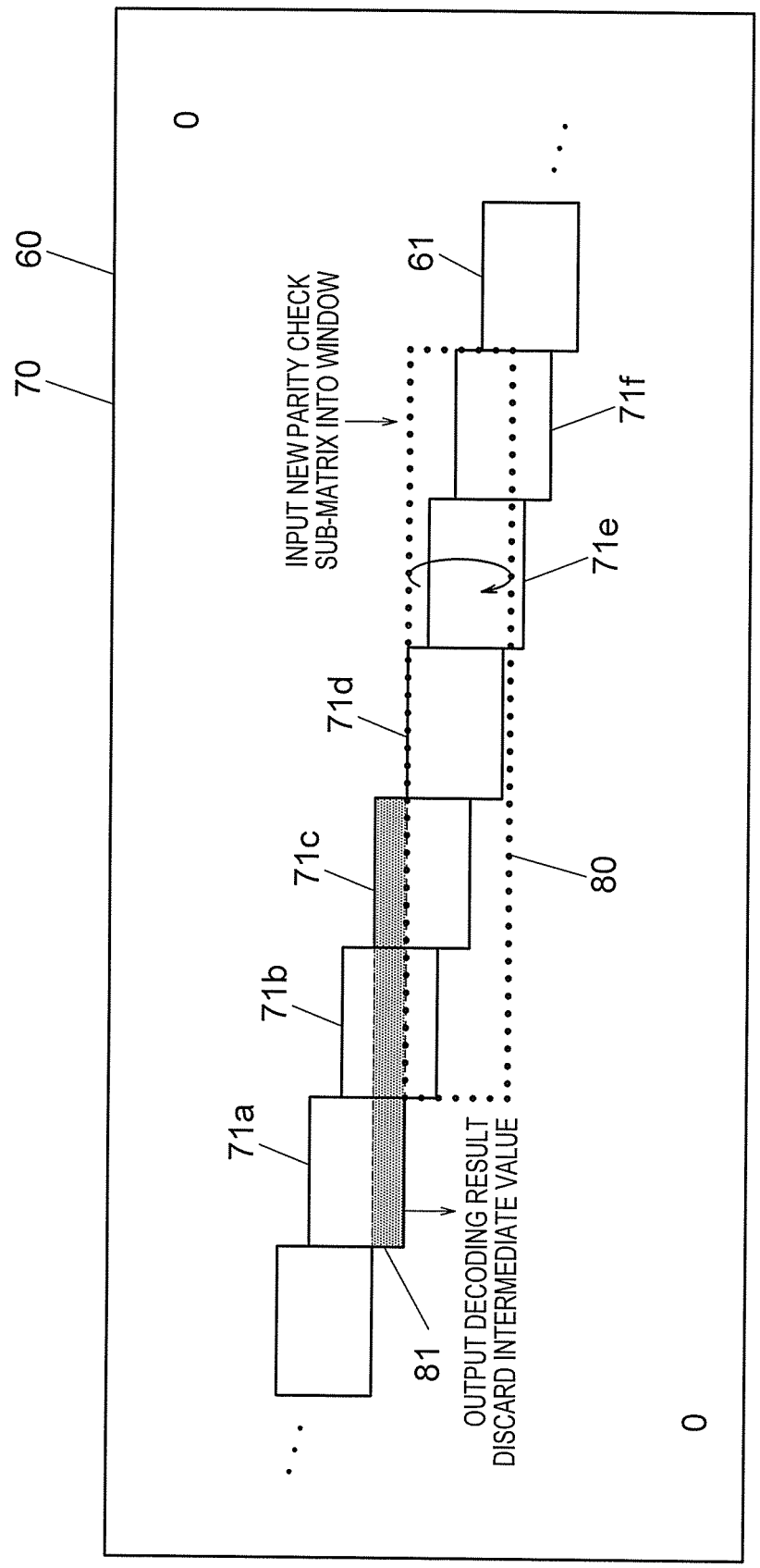
FIG. 8 is a diagram for illustrating an example of the parity check matrix of the spatially-coupled LDPC code to be used in the error correction decoding unit of the optical transmission/reception device according to the first embodiment of the present invention.

The windowed decoding processing involves decoding each row in the column direction in the window 80. That is, as indicated by the thin dotted lines of FIG. 6A, first, processing of decoding a top row 81 in the window 80 is performed. At this time, the row 81 contains each row of the parity check sub-matrices 71a, 71b, and 71c. After that, the processing is advanced sequentially for each row toward the bottom row. Then, when the processing reaches the bottom row in the window 80, processing of decoding the row 81 of the window 80 is performed again from the top toward the bottom. In this manner, the windowed decoding processing involves performing repeated decoding processing for the window 80. The iteration count is hereinafter referred to as a "decoding iteration count". Then, when the decoding processing for the window 80 is all finished by the decoding iteration count, a result of calculation for the top row 81 of the window 80 is output, and intermediate values during calculation are discarded. Further, as illustrated in FIG. 8, the window 80 is shifted by one parity check matrix 71 toward the right bottom direction. With this, the parity check sub-matrix 71a is deleted from the window 80, and a new parity check sub-matrix 71f is newly input to the window 80. This produces the new window 80. The new window 80 extends over five parity check sub-matrices, namely, the parity check sub-matrices 71b, 71c, 71d, 71e, and 71f. In this manner, repeated decoding processing similar to the above-mentioned decoding processing is executed for the new window 80.

When windowed decoding is applied to the spatially-coupled LDPC code, the performance is improved in accordance with the window size of the window 80. At the same time, the memory size required for the decoding processing is required to be expanded in accordance with expansion of the window size. Further, the performance of the above-mentioned decoding scheme is improved in accordance with increase in decoding iteration count. At the same time, the circuit scale and power consumption increase in accordance with increase in decoding iteration count. That is, the window size and the decoding iteration count are required to be increased in order to improve the performance. However, in that case, the size and circuit scale of the memory are required to be increased. When the size and circuit scale of the memory are large, implementation of the circuit becomes difficult. Thus, it is difficult to improve the performance while suppressing expansion of the circuit scale and easiness to implement the circuit. Therefore, the performance and the circuit scale and implementation have a trade-off relationship.

In the first embodiment, the spatially-coupled LDPC decoding processing unit 362 includes a memory corresponding to a window size that can be implemented at the maximum at the time of minimum throughput. The control circuit 12 changes the window size and the decoding iteration count in accordance with throughput input to the error correction decoding device 36, to thereby handle a plurality of throughputs. The window size is set to have a size of the window 80 in the column direction. Thus, in the example of FIG. 8, the size of the window 80 in the column direction has such a width as to contain just one parity check sub-matrix 71, and when the number of rows of the parity check sub-matrix 71 is p, the window size of the window 80 is "p". In the first embodiment, the size of the window 80 in the row direction is set to have a fixed value, but may also be variable. In the example of FIG. 8, the size of the window 80 in the row direction has such a width as to contain just five parity check sub-matrices 71, and thus when the number of columns of the parity check sub-matrix 71 is set to p, the size of the window 80 in the row direction is "p×5".

Further, in order to implement this processing as pipeline processing, decoding processing for the current window 80 is required to be finished at a timing of aligning signals required for processing of the next parity check sub-matrix 71. Thus, as a method of determining the window size and the decoding iteration count for each throughput, for example, a method involving setting a maximum value of the window size at the time of minimum throughput as the maximum value of a memory size that is superior in terms of implementation and setting a maximum value of the iteration count so that a product of the window size and the iteration count is equal to or smaller than a unit time required for the decoding processing is conceivable. However, the method is not limited thereto, and another method may be employed.

Signals subjected to the decoding processing as described above are input to the client signal generation unit 37. When a parity bit for HD-FEC is added to the transmission side, the client signal generation unit 37 performs the decoding processing for HD-FEC. The signals subjected to the decoding processing are retrieved as client signals, and for example, an overhead is added thereto as required to generate client signals. Output from the client signal generation unit 37 is input to the client IF (OUT) 38, and then output to, for example, each client module.

In this manner, the window size and the decoding iteration count can be set variable to flexibly handle throughput of various granularities without changing the circuit configuration at all.

As described above, the optical transmission/reception device according to the first embodiment includes the error correction decoding unit 36 including an error correction decoding device for decoding a received sequence encoded with the LDPC code. The error correction decoding unit 36 performs the decoding processing by using the parity check matrix of the spatially-coupled LDPC code, and the plurality of parity check sub-matrices 71 are combined in the LDPC rule structure in the parity check matrix of the spatially-coupled LDPC code. Further, the decoding processing is windowed decoding processing of performing sequential decoding in units of windows by using the window 80 over one or more parity check sub-matrices 71. The windowed decoding processing is repeatedly executed by the decoding iteration count. The window size of the window 80 and the decoding iteration count are variable, and are input from the control circuit 12 connected to the error correction decoding device 36. The window size and the decoding iteration count are determined by the control circuit 12 in accordance with throughput of an optical signal transmitted/received by the optical transmission/reception device. As a result, the optical transmission/reception device according to the first embodiment can handle various transfer rates (throughputs). As described above, in the first embodiment, the window size and the decoding iteration count are set variable, to thereby flexibly handle throughput of various granularities without changing the circuit configuration at all.

Second Embodiment

In the first embodiment described above, the window size of the window 80 and the decoding iteration count are set variable to handle a plurality of throughputs. The spatially-coupled LDPC decoding operation circuit 3622 is constructed by one large arithmetic core circuit. In this manner, when the spatially-coupled LDPC decoding operation circuit 3622 is constructed by one large arithmetic core circuit, the complexity of the circuit increases. When a window size and a decoding iteration count are freely set, estimation of the scale of the decoding processing circuit becomes difficult, and as a result, re-designing of the decoding processing circuit is likely to occur.

Figure 9:
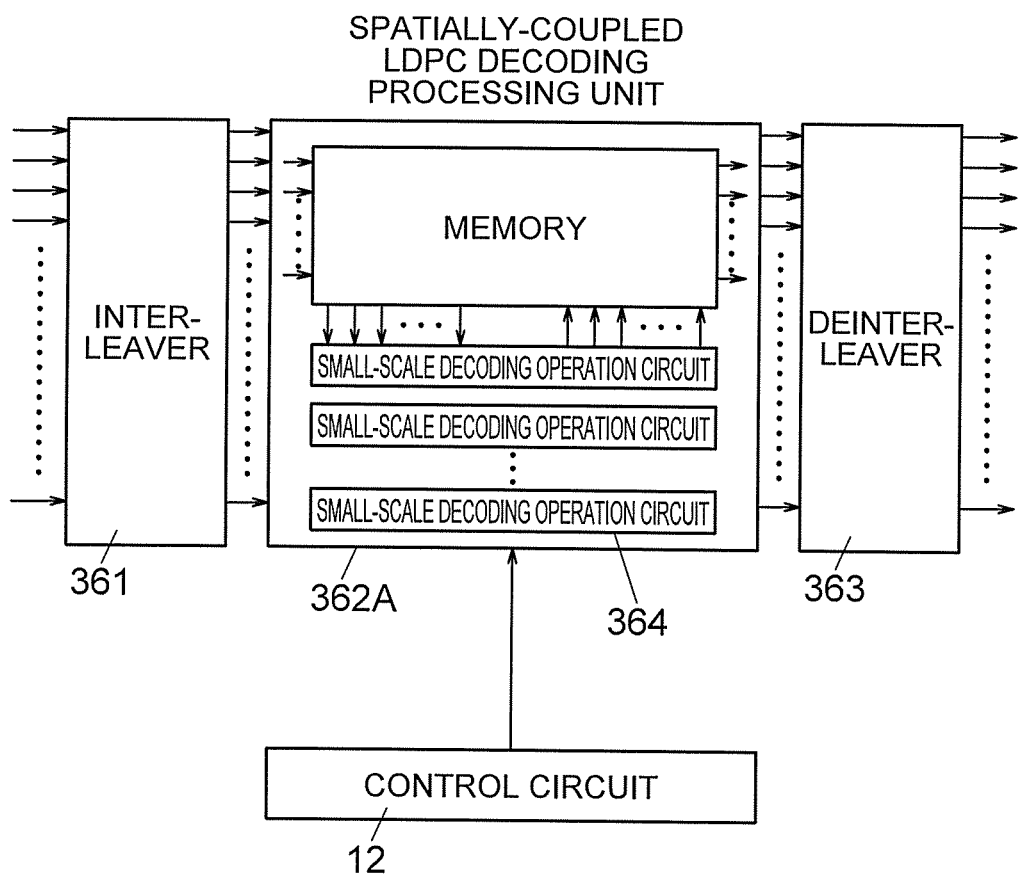
FIG. 9 is a diagram for illustrating a configuration of the error correction decoding unit included in an optical transmission/reception device according to a second embodiment of the present invention.

FIG. 9 is a diagram for illustrating a configuration of the error correction decoding unit 36 in a second embodiment of the present invention. As illustrated in FIG. 9, in the second embodiment, two or more small-scale decoding operation circuits 364 are arranged in parallel instead of the spatially-coupled LDPC decoding operation circuit 3622 illustrated in FIG. 5.

Those small-scale decoding operation circuits 364 can all be implemented by the same circuit configuration. In this manner, the small-scale decoding operation circuit 364 can have a smaller circuit configuration than the spatially-coupled LDPC decoding operation circuit 3622 of FIG. 5, to thereby estimate the circuit scale relatively accurately. In the second embodiment, with the above-mentioned configuration, it is possible to flexibly design and construct the circuit scale/error correction performance/throughput of the error correction decoding device 36.

As described above, also in the second embodiment, it is possible to obtain an effect similar to that of the first embodiment. Further, in the second embodiment, the error correction decoding unit 36 is constructed by two or more small-scale decoding operation circuits 364, and thus it is possible to flexibly design and construct the circuit scale/error correction performance/throughput of the error correction decoding device 36.

Third Embodiment

Figure 10:
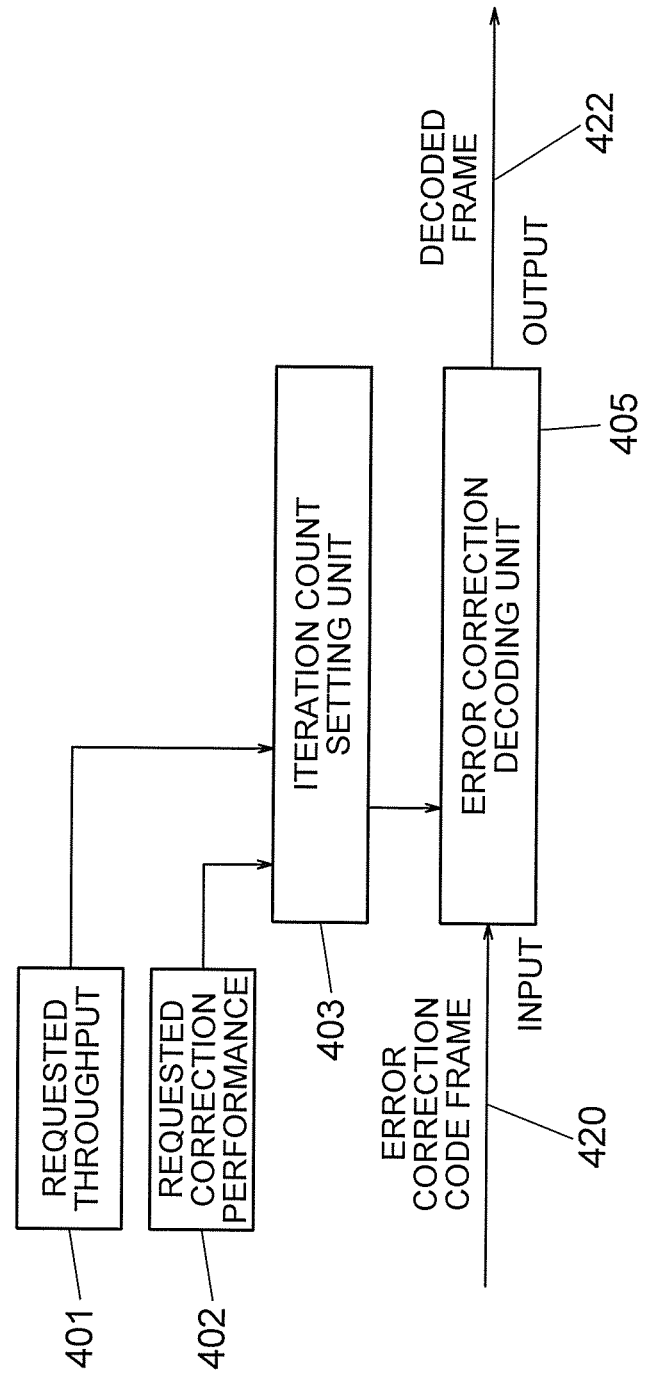
FIG. 10 is a block diagram for illustrating a configuration of an optical transmission/reception device according to a third embodiment of the present invention.

FIG. 10 is a block diagram for illustrating a configuration of an error correction decoding device according to a third embodiment of the present invention. As illustrated in FIG. 10, the error correction decoding device includes a iteration count setting unit 403 and an error correction decoding unit 405. The error correction decoding unit 405 has, for example, a configuration similar to that of the spatially-coupled LDPC decoding processing unit 362 of FIG. 5, and an error can be corrected repeatedly. In the following, a description is given of the configuration of the error correction decoding device.

In FIG. 10, the iteration count setting unit 403 sets the decoding iteration count of the error correction decoding unit 405 by setting, as the maximum value, a iteration count by which decoding processing is finished before start of decoding processing for the next error correction code sequence, based on a requested throughput 401 and a requested correction performance 402. The requested correction performance 402 is optimal error correction performance required due to, for example, a reception error rate or power consumption assumed by a transfer distance. The user inputs the requested throughput 401 and the requested correction performance 402 into the iteration count setting unit 403 so that the iteration count setting unit 403 sets the iteration count by using, for example, calculation set in advance. In other cases, the user may determine the optimal decoding iteration count based on the requested throughput 401 and the requested correction performance 402 on the desk, and input the decoding iteration count into the iteration count setting unit 403 for setting. The iteration count setting unit 403 generates a control signal based on the decoding iteration count by, for example, a register, and passes the control signal to the error correction decoding unit 405.

The error correction decoding unit 405 performs error correction decoding processing repeatedly for an error correction code frame 420 by the number of times of the decoding iteration count in accordance with the control signal from the iteration count setting unit 403. The error correction decoding unit 405 outputs a decoded frame 422 after performing the error correction decoding processing repeatedly by the number of times of the decoding iteration count. For example, in the case of an LDPC code, the error correction decoding unit 405 performs row calculation and column calculation repeatedly.

Figure 11:
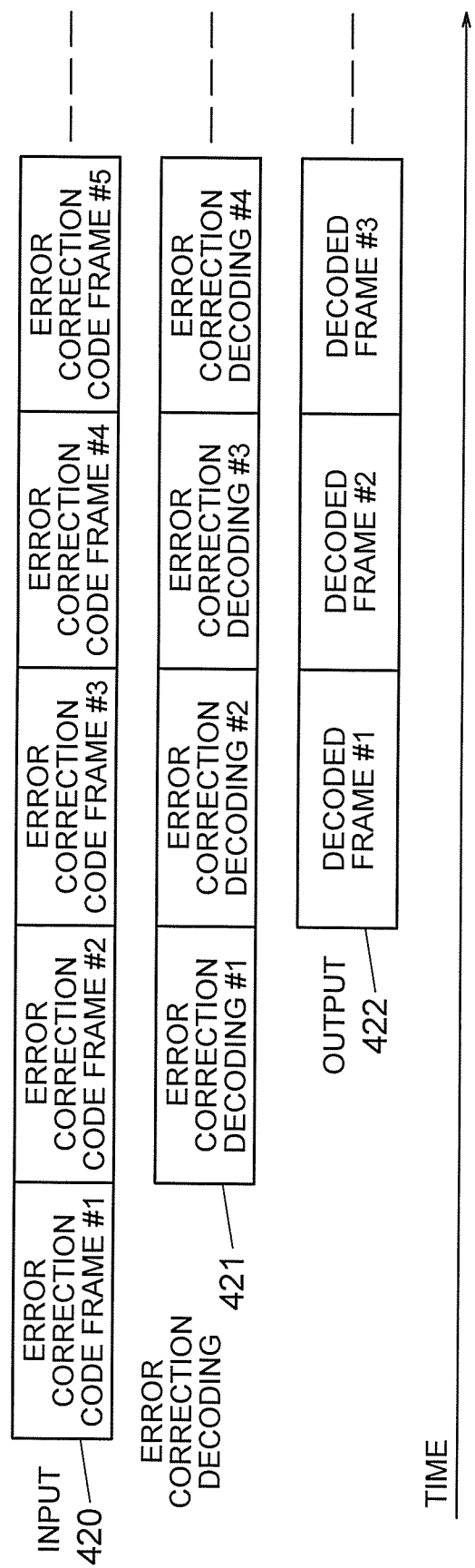
FIG. 11 is a diagram for illustrating an example of an operation relationship, which is similar to that of the related-art, of the error correction decoding device according to the third embodiment of the present invention.

FIG. 11 is a diagram for illustrating an example of an operational relationship in a case where the requested throughput 401 is set to a maximum throughput and the decoding iteration count is set to a maximum iteration count in the configuration of the error correction decoding device of FIG. 10. In the example of FIG. 11, it is assumed that a period required for input of the error correction code frame 420 formed of error correction codewords and a period required for output of the error correction decoded frame 422 are the same as each other. When the error correction decoding unit 405 includes a storage (memory) having a capacity enough to store an error correction code frame on the input side and the output side, the error correction decoding unit 405 can finish the decoding processing for previous error correction decoding 421 by the time immediately before the end of input of the next error correction code frame 420, and output the error correction decoded frame 422 without collision.

Figure 12:
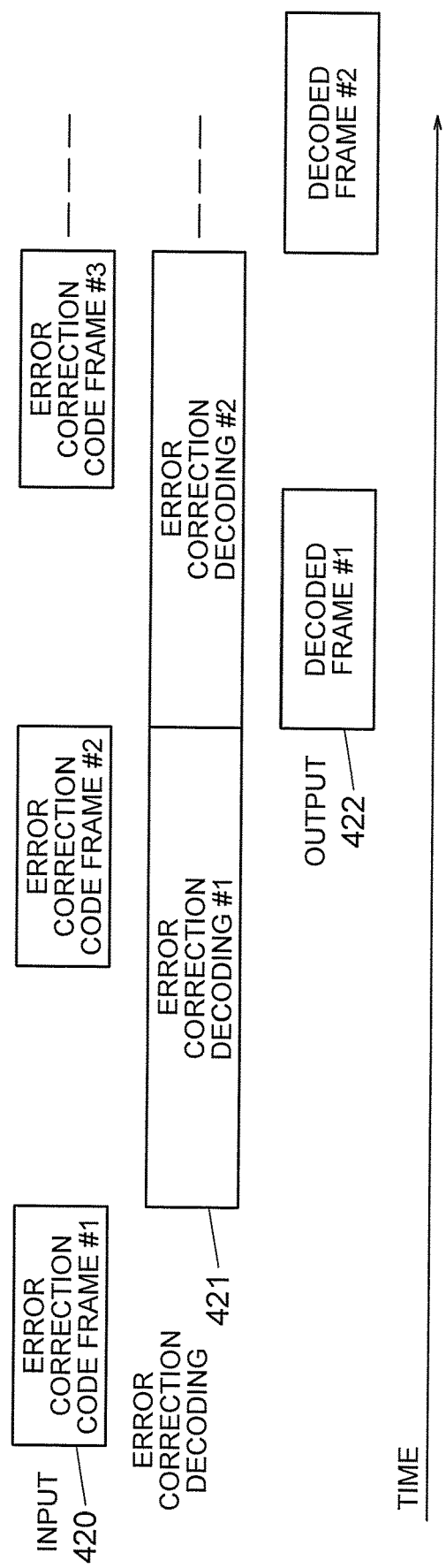
FIG. 12 is a diagram for illustrating an example of an operation relationship at a time when throughput is set to ½ and a iteration count is approximately doubled for input of FIG. 11 in the optical transmission/reception device according to the third embodiment of the present invention.

FIG. 12 is a diagram for illustrating an example of an operational relationship in a case where the requested throughput 401 is set to half the throughput of FIG. 11 and the decoding iteration count is set to a maximum iteration count in the configuration of the error correction decoding device of FIG. 10. In this case, there remains twice a period until completion of input of the next error correction code frame 420. Thus, the error correction decoding unit 405 can approximately double the decoding iteration count, and improvement of the correction capacity can be expected.

Figure 13:
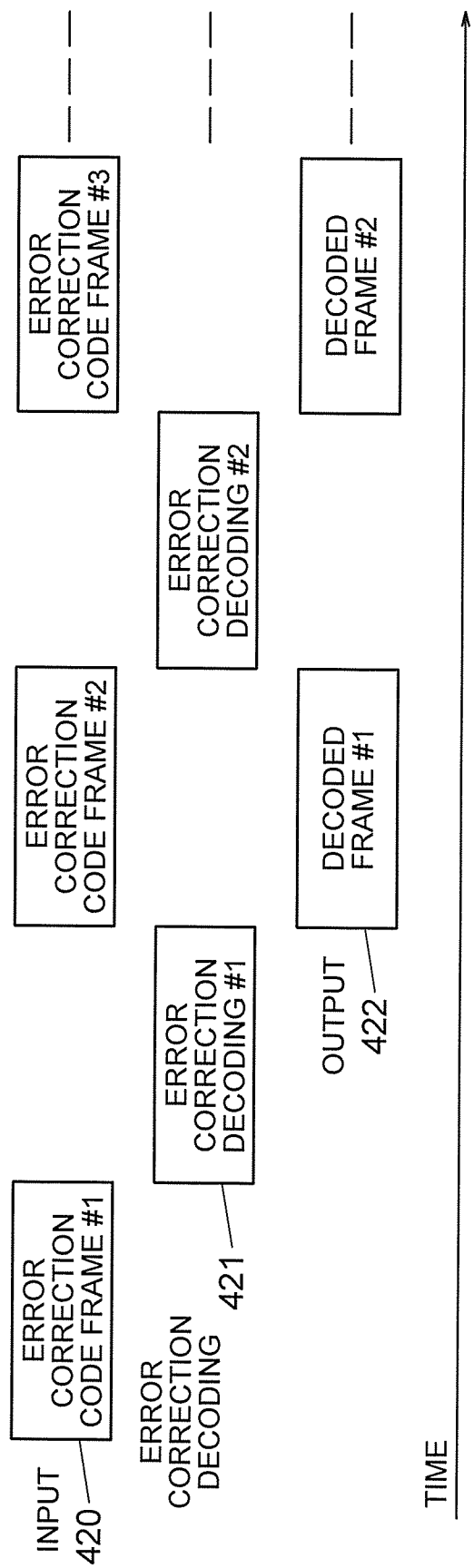
FIG. 13 is a diagram for illustrating an example of an operation relationship at a time when the iteration count is set similarly to FIG. 11 for input of FIG. 12 in the optical transmission/reception device according to the third embodiment of the present invention.

FIG. 13 is a diagram for illustrating an example of an operational relationship in a case where the requested throughput 401 is set to half the throughput of FIG. 11 and the decoding iteration count is set to half the iteration count. This is an example of the operational relationship in a case where the iteration count is set to half the maximum because the error rate at the time of input is small due to, for example, short-distance transfer. In this case, the processing period for the next error correction code 421 becomes about half the period. Thus, the error correction decoding unit 405 can be deactivated except for output of the decoded frame 422 until completion of input of the next error correction code frame 420. Thus, the error correction decoding unit 405 is expected to achieve low power consumption. The delay time until output also becomes half the time illustrated in FIG. 10.

In the decoding processing for an LDPC code, row calculation and column calculation are considered to be performed for the entire code sequence in units of decoding iteration count. However, the code sequence can be divided into a plurality of blocks to perform the decoding processing. Further, the iteration count can be set by the unit of the number of blocks. Further, windowed decoding used for, for example, a convolutional LDPC code can be applied to iteration count control in units of windowed decoding.

As described above, in the third embodiment, the iteration count setting unit 403 sets the decoding iteration count of the error correction decoding unit 405 based on the requested throughput 401 and the requested correction performance 402 required due to, for example, the transfer distance or power consumption, to thereby handle a plurality of throughput and repeatedly perform error correction decoding processing that has suppressed power consumption.

Fourth Embodiment

The error correction decoding device according to the third embodiment described above outputs the decoded frame 422 after performing decoding processing by the number of times of the decoding iteration count set in the iteration count setting unit 403. In this case, the delay period for decoding processing is different depending on the set decoding iteration count, and thus designing of a subsequent system may become complicated. When output of the previous error correction decoded frame 422 is complete by the time immediately before end of the decoding processing 421 for the next error correction code frame 420, the next error correction code frame 420 can be output without collision. At the same time, the processing delay period of the system is required to be made smaller, and the decoded frame 422 is desired to be output before start of the decoding processing 421 for the next error correction code frame 420.

Figure 14:
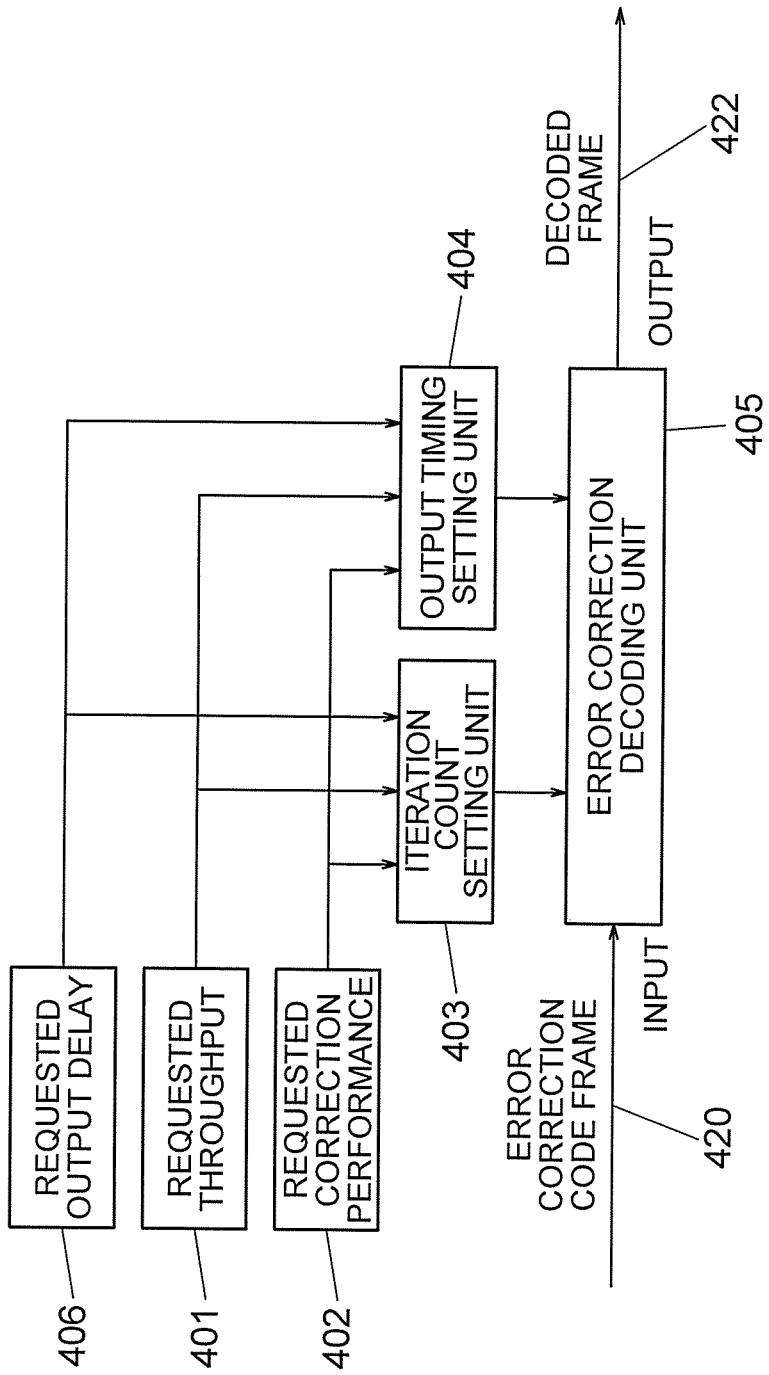
FIG. 14 is a block diagram for illustrating an example of a configuration of an error correction decoding device according to a fourth embodiment of the present invention.

FIG. 14 is an illustration of the configuration of an error correction decoding device according to a fourth embodiment of the present invention. In the fourth embodiment, the error correction decoding unit 405 includes the iteration count setting unit 403 configured to set the decoding iteration count and an output timing setting unit 404 configured to set an output timing based on a requested output delay 406. A difference between FIG. 10 and FIG. 14 is that the output timing setting unit 404 is added in FIG. 14. The other components of FIG. 14 are the same as those of FIG. 10, and thus a description thereof is omitted here.

On the basis of the requested output delay 406, the requested throughput 401, and the requested correction performance 402, the output timing setting unit 404 sets an output timing that is based on a iteration count that is roughly set compared to the decoding iteration count set in the iteration count setting unit 403. The output timing setting unit 404 is required to set the output timing so that processing by the decoding iteration count based on the requested throughput 401 and the requested correction performance 402 can be finished. Alternatively, in contrast, the requested output delay 406 can set the upper limit on the decoding iteration count from the iteration count setting unit 403.

After the error correction decoding unit 405 capable of enabling repeated correction performs decoding processing by the number of times of the decoding iteration count set in the iteration count setting unit 403 and stores the error correction decoded frame 422 until the output timing controlled through an output timing control signal received from the output timing setting unit 404, the error correction decoding unit 405 outputs the error correction decoded frame 422.

Figure 15:
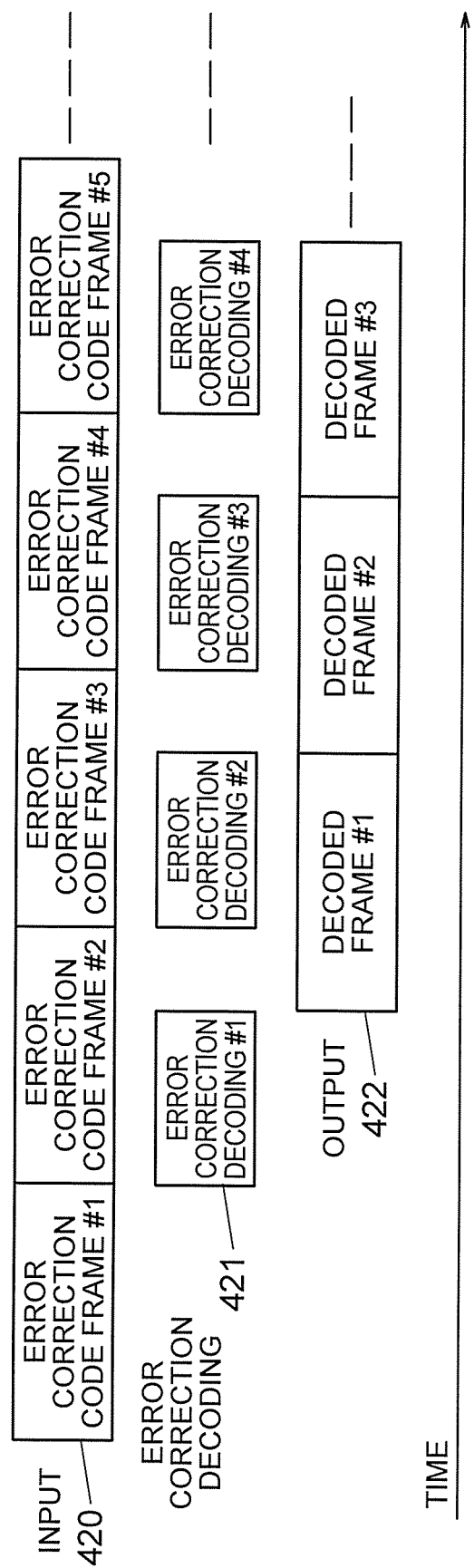
FIG. 15 is a diagram for illustrating an example of an operation relationship at a time when a decoded frame is set similarly to that of FIG. 12 for input and an error correction decoding operation of FIG. 13 in the error correction decoding device according to the fourth embodiment of the present invention.

FIG. 15 is a diagram for illustrating an example of an operation relationship at a time when the output timing is set based on a predictable decoding iteration count that is not maximum from the output timing setting unit 404 in the configuration of the error correction decoding device of FIG. 14. In this case, in the error correction code 421, decoding #2 and subsequent processing are processing of decoding by the predictable maximum iteration count, which is set by the iteration count setting unit 403. On the other hand, the iteration count setting unit 403 sets a smaller iteration count for the decoding #1. However, the output timing setting unit 404 sets the output timing of the decoding #1 to an output timing similar to that of, for example, the decoding #2. Therefore, the decoded frame 422 can be output without interruption of switching from the decoded frame #1 to the decoded frame #2.

As described above, in the fourth embodiment, the output timing setting unit 404 configured to set the output timing based on the requested output delay 406 is provided separately from the iteration count setting unit 403 so that it is possible to output an error correction decoding frame within a stable and desirable delay even when there is a change in decoding iteration count set by the iteration count setting unit 403.

Fifth Embodiment

In the third and fourth embodiments described above, a description has been given of the configuration that uses one error correction decoding unit 405. However, it is conceivable that a plurality of error correction decoding units are aligned in parallel to handle high speed throughput for processing.

Figure 16:
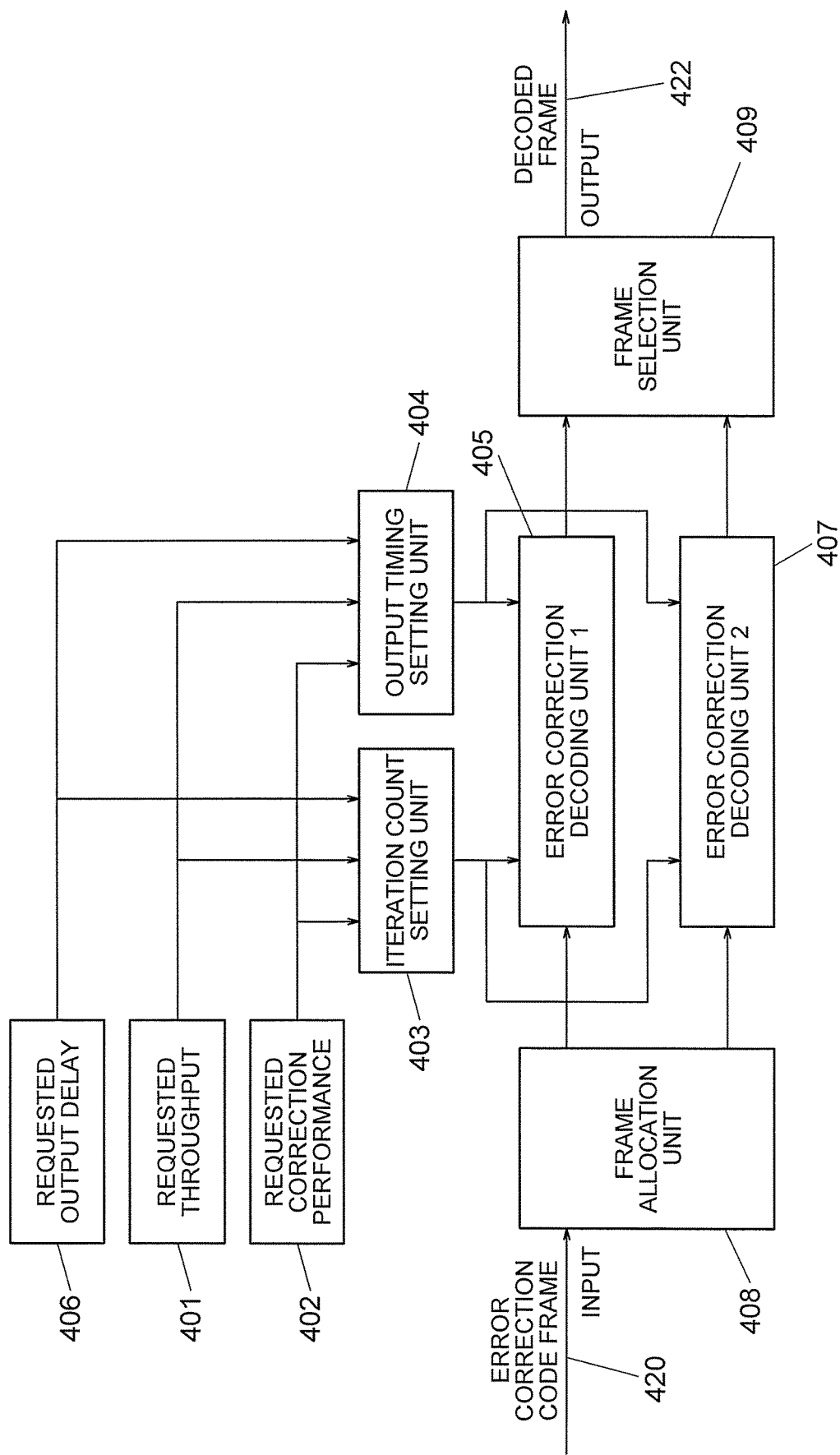
FIG. 16 is a block diagram for illustrating an example of a configuration of an error correction decoding device according to a fifth embodiment of the present invention.

FIG. 16 is a diagram for illustrating an error correction decoding device according to a fifth embodiment of the present invention. In FIG. 16, a plurality of error correction decoding units, namely, error correction decoding units 405 and 407 are provided. A configuration of the error correction decoding unit 407 is similar to the configuration of the error correction decoding unit 405, and thus a description thereof is omitted here. Further, as illustrated in FIG. 16, a frame allocation unit 408 is provided before the error correction decoding units 405 and 407, and a frame selection unit 409 is provided after the error correction decoding units 405 and 407. In FIG. 16, there is illustrated a case in which the number of error correction decoding units is two. However, there may be any number of error correction decoding units. Other components are the same as those of the third and fourth embodiments, and thus a description thereof is omitted here.

The error correction code frame 420 is input to the frame allocation unit 408. The frame allocation unit 408 inputs the input error correction code frame 420 to the error correction decoding unit 405 and the error correction decoding unit 407 alternately. Control signals from the iteration count setting unit 403 and the output timing setting unit 404 are input to the error correction decoding unit 405 and the error correction decoding unit 407 in common. Further, the frame selection unit 409 selects and outputs the error correction decoded frame 422, which is alternately output from the error correction decoding unit 405 and the error correction decoding unit 407.

As described above, in the fifth embodiment, it is possible to perform repeated processing that is similar to that performed by twice the throughput in the configuration of the fourth embodiment by providing, for example, two error correction decoding units. When the different requested correction performance 402 and the different error correction code frame 420 can be input to the error correction decoding unit 405 and the error correction decoding unit 407, respectively, different control signals from the iteration count setting unit 403 are set and the same control signal from the output timing setting unit 404 is set, to thereby be able to output the desired error correction decoded frame 422 while suppressing power consumption.

Sixth Embodiment

In the first to fifth embodiments described above, a description has been given of a case in which the error correction decoding device for an LDPC code, in particular, a convolutional LDPC code including the spatially-coupled LDPC code is applied to the optical transmission/reception device. However, the configuration is not limited thereto, and an error correction code capable of performing repeated decoding has various code configurations such as a turbo code, a product code, and a concatenated code. Those codes can also control the setting of the decoding iteration count similarly to the LDPC code, and thus can be applied to the optical transmission/reception devices according to the first to fifth embodiments. Further, those codes can be applied not only to decoding by the optical transmission/reception device but also to decoding of an error correction code capable of being decoded repeatedly in other communication methods such as terrestrial radio communication, satellite communication, and satellite optical communication.

The invention claimed is:

1. An error correction decoding device for decoding an encoded received sequence that is decodable repeatedly, the error correction decoding device comprising:
   a memory; and
   a control circuit configured to
     determine an output timing for outputting decoding processing result, based on requested throughput and requested delay which is requested within a range satisfying repeated performance of the decoding processing by a number of times of decoding iteration count set based on requested correction performance; and
     repeatedly perform decoding processing for the encoded received sequence by the number of times of the decoding iteration count.

2. The error correction decoding device according to claim 1, wherein the control circuit is further configured to set the decoding iteration count, within a range of a maximum iteration count or below, in accordance with the requested throughput and the requested correction performance, so as to satisfy each of the requested throughput and the requested correction performance, wherein the maximum iteration count satisfies a data rate.

3. The error correction decoding device according to claim 1, wherein the encoded received sequence includes an LDPC code sequence.

4. The error correction decoding device according to claim 1,
   wherein there is a plurality of the error correction decoders, and
   wherein the control circuitry is further configured to:
     sequentially input the encoded received sequence into the plurality of the error correction decoders in an order set in advance; and select and output a decoded received sequence which is output from the plurality of the error correction decoders.

5. The error correction decoding device according to claim 1, wherein the decoding processing includes windowed decoding processing of sequentially performing decoding in units of windows by using a window over one or more parity check sub-matrices, wherein a window size of the window and the decoding iteration count are variable, and wherein the window size and the decoding iteration count are input from a control circuit connected to the error correction decoding device, wherein the control circuit is configured to determine the window size and the decoding iteration count based on the requested throughput and the requested correction performance.

6. An optical transmission/reception device, comprising an error correction decoding device according to claim 1.

* * * * *